United States Patent
Matz et al.

(10) Patent No.: US 7,037,823 B2
(45) Date of Patent: May 2, 2006

(54) METHOD TO REDUCE SILANOL AND IMPROVE BARRIER PROPERTIES IN LOW K DIELECTRIC IC INTERCONNECTS

(75) Inventors: Phillip D. Matz, McKinney, TX (US);
Sameer Ajmera, Richardson, TX (US);
Changming Jin, Plano, TX (US);
Trace Q. Hurd, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/901,708

(22) Filed: Jul. 27, 2004

(65) Prior Publication Data
US 2005/0233586 A1    Oct. 20, 2005

Related U.S. Application Data

(60) Provisional application No. 60/564,299, filed on Apr. 20, 2004.

(51) Int. Cl.
*H01L 21/4763*    (2006.01)

(52) U.S. Cl. .................................. 438/624; 438/618
(58) Field of Classification Search ............. 438/618, 438/629, 622–624, 637, 672, 675, 687
See application file for complete search history.

(56) References Cited

U.S. PATENT DOCUMENTS

2004/0198066 A1*  10/2004  Verhaverbeke ............ 438/745

* cited by examiner

*Primary Examiner*—David Vu
(74) *Attorney, Agent, or Firm*—Peter K. McLarty; W. James Brady, III; Frederick J. Telecky, Jr.

(57) ABSTRACT

A trench and via structure is formed in a low k dielectric layer (100) formed over a silicon substrate (10). Super critical $CO_2$ and a first silylization agent are used to form a chemically bonded high density surface layer (160). Silanol species are removed from the low k dielectric layer (100) using super critical $CO_2$ and a second silylization agent. A barrier layer (190) and copper (200) are used to fill the trench and via structure.

14 Claims, 2 Drawing Sheets

METHOD TO REDUCE SILANOL AND IMPROVE BARRIER PROPERTIES IN LOW K DIELECTRIC IC INTERCONNECTS

CROSS-REFERENCE TO RELATED PATENT/PATENT APPLICATIONS

This patent application claims the benefit of the filing date of the provisional special application Ser. No. 60/564,299 filed Apr. 20, 2004. The provisional special application Ser. No. 60/564,299 filed Apr. 20, 2004 is hereby incorporated herein by reference.

FIELD OF THE INVENTION

This invention relates generally to the field of electronic devices and more particularly to a method of reducing silanol and improving the barrier properties in low K dielectric integrated circuit interconnect structures.

BACKGROUND OF THE INVENTION

Integrated circuits are formed by interconnecting a number of electronic devices formed on a semiconductor substrate. The electronic devices (such as transistors, resistors, capacitors, diodes, etc) are interconnected by forming metal lines in dielectric layers formed above the semiconductor substrate. Traditionally, the dielectric layers have been formed using silicon oxide deposited using a chemical vapor deposition (CVD) process. The interconnect structure introduces stray capacitance into the integrated circuit that reduces the speed at which the integrated circuit can operate. The stray capacitance is proportional to the dielectric constant of the dielectric layers and one method of reducing the stray capacitance is to use dielectric material with a low dielectric constant to form the IC interconnect structures.

Low dielectric constant (low k) dielectric material has a higher porosity compared to silicon oxide and will be more susceptible to process induced damage and impurity diffusion during the fabrication of the integrated circuit. During integrated circuit manufacture, the interconnect structures are typically formed by first forming a low k dielectric layer over the silicon substrate. A trench is then formed in the low k dielectric material using a photoresist mask and a chemical plasma etching process. A barrier layer is formed in the trench and copper is formed over the barrier layer to fill the trench. Chemical mechanical polishing is used to remove the excess copper leaving a copper metal line formed in the low k dielectric layer. During the chemical plasma etching process used to form the trench, the low k dielectric layer can be modified by exposure to the chemical plasma. The modification of the low k dielectric layer often takes the form of a replacement of a $CH_3$ group in the low k dielectric with a silanol group resulting in an increase in the dielectric constant of the low k dielectric layer. In addition, during the formation of the barrier layer, the porosity of the low k dielectric layer often results in the unwanted diffusion of the metallic barrier layer into the low k dielectric layer. This is illustrated in FIG. 1.

As illustrated in FIG. 1, a dielectric layer 20 is formed over a semiconductor substrate 10. The semiconductor substrate 10 will contain electronic devices such as transistors that are omitted from the Figure for clarity. A dielectric layer is formed over the semiconductor substrate 10 and a copper interconnect metal line 40 is formed in a trench that is formed in the dielectric layer. As described above, a barrier layer 30 is formed in the trench prior to the formation of the copper metal line 40. Following the formation of the copper interconnect line 40, a second dielectric layer 50 is formed over the first dielectric layer 20. The second dielectric layer 50 is formed using a low k dielectric material. A trench and via are formed in the low k dielectric layer using a photoresist masks and chemical plasma etching processes. As described above, during the chemical plasma etch processes, the incorporation of a silanol group into the low k dielectric layer will result in an increase in the dielectric constant of the low k dielectric layer 50. During the formation of the barrier layer 60, portions of the barrier layer 80 will diffuse into the low k dielectric layer 50 resulting in increased leakage currents and/or integrated circuit failure. Following the formation of the barrier layer 60, copper is used to form the copper line and via structure 70 shown in FIG. 1.

There is therefore a great need for a method to reduce the silanol incorporation into the low k dielectric material and to inhibit the diffusion of the barrier layer material. The instant invention addresses this need.

SUMMARY OF THE INVENTION

A method for treating low-K dielectric layers in integrated circuits is presented. In a first embodiment, a dielectric layer is formed over a semiconductor substrate. The surface of the dielectric layer is exposed to super critical $CO_2$ and a first reaction agent comprising a silylization agent and in particular comprising hexamethyldisilazane (HMDS). Other suitable silylization agents include tetramethyldisilazane (TMDS) and trimethylchlorosilane (TMCS). The HMDS will react with process induced species in the low K dielectric to selectively form a chemically bonded surface layer with a higher density and lower interpenetration probability compare to an untreated low k dielectric layer.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIG. 2 through FIG. 5 illustrates various aspects of the formation of integrated circuit metal interconnect structures according to an embodiment of the instant invention.

Figure 1:
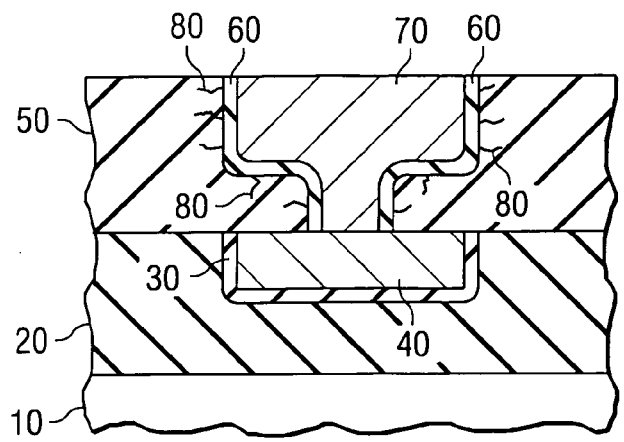
FIG. 1 is a cross-sectional diagram showing an integrated circuit metal interconnect structure according to the prior art.
Figure 2:
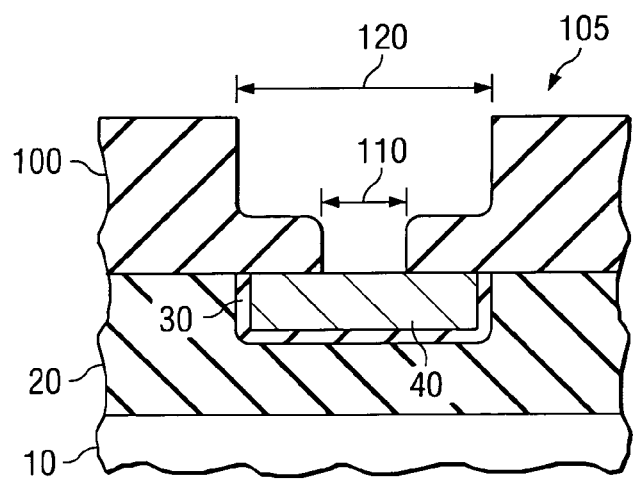
FIG. 2 is a cross-sectional diagram showing a low k dielectric layer with a trench and via.

As shown in FIG. 2, a semiconductor structure 105 comprises a dielectric layer 20 formed over a semiconductor substrate 10. A copper interconnect line 40 and barrier 30 are formed in the dielectric layer 20. A low k dielectric layer 100 is formed over the dielectric layer 20 and the semiconductor substrate 10. In this disclosure, low k dielectric describes a dielectric material with a dielectric constant less than 3.0. Furthermore, in this disclosure, the porosity of the low k dielectric material is over 15% by volume with a minimum pore diameter of 5A. In various embodiments of the instant invention, the low k dielectric material can comprise methylsilsesquioxane (MSQ), carbon doped oxides (SiOC) and other suitable low k dielectric material. A via 110 and trench 120 are formed in the low k dielectric layer 100 using photolithographic masks and chemical plasma etching. As described above, during the chemical plasma etching of the low k dielectric layer 100, silanol groups can become incorporated into the low k dielectric 100 resulting in an increase in the dielectric constant of the layer 100.

Figure 3:
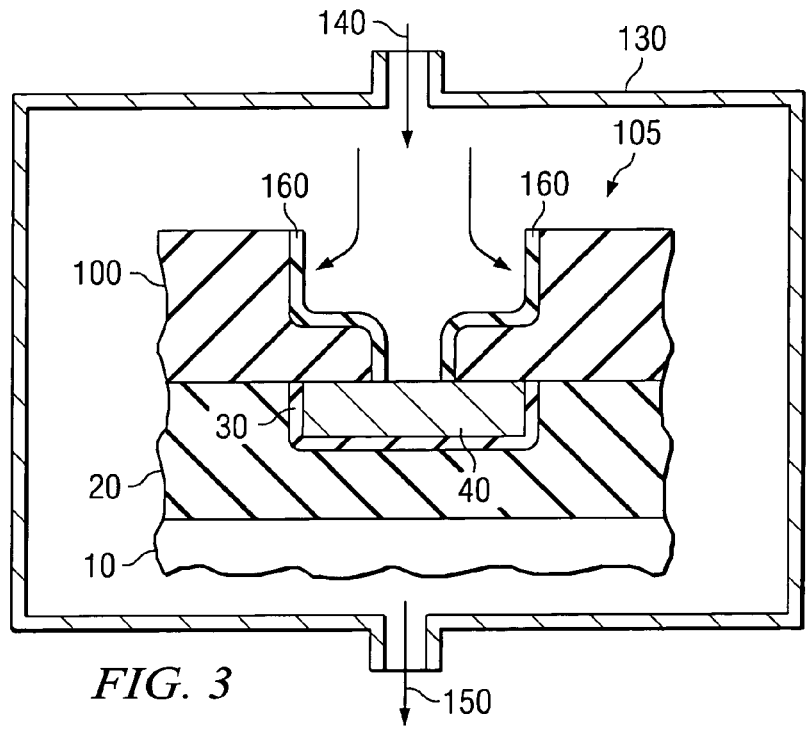
FIG. 3 is a cross-sectional diagram showing the formation of a dielectric barrier along the sides of the trench and via in the low k dielectric layer according to an embodiment of the instant invention.

In an embodiment of the instant invention, the semiconductor structure 105 shown in FIG. 2 is placed in the processing chamber 130 as shown in FIG. 3. The processing chamber 130 is capable of exposing the dielectric layer 100 to super critical carbon dioxide ($scCO_2$) and silylization agents according to various embodiments of the instant invention. In a first embodiment, the semiconductor structure 105 comprising the low k dielectric layer 100 is placed in the processing chamber 130. Liquid $CO_2$ is flowed into the chamber through the inlet 140. With the temperature in the chamber set at about 60° C., the pressure in the chamber is raised to about 2900 PSI causing the formation of $scCO_2$. It should be noted that $scCO_2$ can be formed at temperatures above 31° C. and pressures above 1050 PSI. Any such combination of temperatures and pressures can be used to form $scCO_2$ in the process chamber 130. A dehydrating species (methanol, ethanol, isopropyl alcohol, etc.) is input into the chamber along with the $scCO_2$ to remove any water that may be present in the chamber and on the surface or within the pores of the low k dielectric layer 100. The water species is purged from the chamber 130, and a first reaction agent is input into the chamber 130 along with the $scCO_2$. In an embodiment, the first reaction agent comprises a silylization agent and in particular comprises hexamethyldisilazane (HMDS). Other suitable silylization agents include tetramethyldisilazane (TMDS) and trimethylchlorosilane (TMCS). During the chemical etching processes used to form both the via 110 and trench 120 structure, the surface of the low k dielectric that is exposed to the chemical plasma etch will incorporate various species such as $O_{3/2}Si$—OH (silanol), $O_{3/2}Si$—$CH_3$ (methyl), $O_{3/2}Si$—H (hydride), and $O_{3/2}Si$—F (fluoride). The HMDS will react with these species to selectively form a chemically bonded surface layer 160 with a higher density and lower interpenetration probability compare to the untreated surface of the low k dielectric layer 100. The term "high density" will be used to describe the layer 160 that is formed using $scCO_2$ and HMDS (or silylization agents). In this disclosure, the term "high density" refers to a density that is higher than the density of the low k dielectric surface before reaction with the silylization agent. The $scCO_2$ will enhance both the transportation of the silylization to the reaction sites in the low k dielectric layer as well as the removal of the reaction byproducts. Following the purging of the unwanted reaction byproducts through an outlet 150 in the process chamber 130, the semiconductor structure 105 can be removed from the process chamber 130. In a further embodiment of the instant invention, before removal from the process chamber 130 the semiconductor structure 105 can be exposed to a second reaction agent to further remove additional incorporated species from the low k dielectric layer 100. This is shown in FIG. 4.

Figure 4:
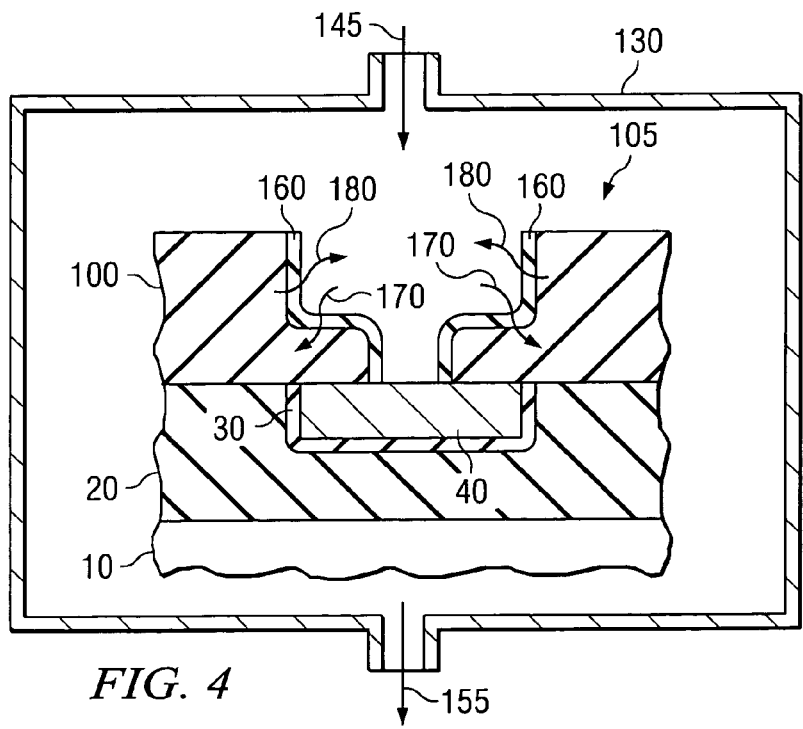
FIG. 4 is a cross-sectional diagram showing the extraction of the silanol group from the low k dielectric layer according to an embodiment of the instant invention.

As shown in FIG. 4, $scCO_2$ is formed in the process chamber 130 using a process similar to that described above. A dehydrating species (methanol, ethanol, isopropyl alcohol, etc.) is input into the chamber along with the $scCO_2$ to remove any water that may be present in the chamber and on the surface or within the pores of the low k dielectric layer 100. The water species is purged from the chamber 130, and a second reaction agent is input into the chamber 130 along with the $scCO_2$ (145 in FIG. 4). In an embodiment, the second reaction agent comprises a silylization agent and in particular comprises trimethylchlorosilane (TMCS). Other suitable silylization agents include tetramethyldisilazane (TMDS) and hexamethyldisilazane (HMDS). The $scCO_2$ will transport the silylization agent into the low k dielectric layer 100 as shown by 170 in FIG. 4. In the low k dielectric layer 100, the silylization agent will react with species at various reaction sites in the dielectric. The species at the reaction sites in the low k dielectric layer 100 include $O_{3/2}Si$—OH (silanol), $O_{3/2}Si$—$CH_3$ (methyl), $O_{3/2}Si$—H (hydride), and $O_{3/2}Si$—F (fluoride) which are formed in the low k dielectric during chemical plasma etching process and other processes. The silylization agents will react with the species replacing them with function groups from the silylization agents. The $scCO_2$ will transport the byproducts of the reaction out of the low k dielectric layer 100 as shown by 180 in FIG. 4. The byproducts are purged from the process chamber 130 through the outlet 155 as shown in FIG. 4. The net result of the above described process is a lowering of the dielectric constant of the low k dielectric layer 100.

Figure 5:
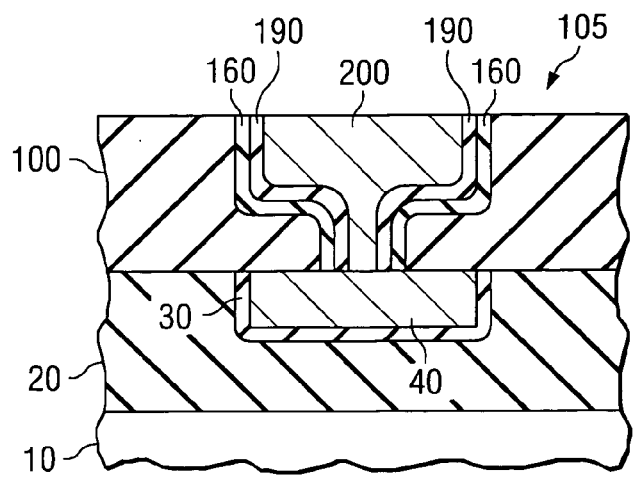
FIG. 5 is a cross-section showing the completed structure according to an embodiment of the instant invention.

Following the removal of the semiconductor structure 105 from the process chamber 130, a barrier layer 190 is formed in the trench and via. In a embodiment, the barrier layer comprises titanium nitride formed using a CVD process with precursors such as tetrakis-(dimethylamido)titanium TDMAT and tetrakis-(diethylamido)titanium TDEAT. Other materials that can be used to form the barrier layer 190 comprise physical vapor deposition (PVD) of Ta and TaN barriers suitable for performing the role of a copper diffusion and electromigration barrier. Following the formation of the barrier layer 190, copper 200 is used to fill the via and trench. The copper interconnect 200 can be formed using electrolytic formation following by chemical mechanical polishing. As shown in FIG. 5, the high density layer 190 prevents the penetration of the barrier material into the low k dielectric layer 100. This provides a significant advantage over existing methods and structures.

Although the present invention has been described with several embodiments, various changes and modifications may be suggested to one skilled in the art. It is intended that the present invention encompass such changes and modifications that follow within the scope of the appended claims.

We claim:

1. A method for forming an integrated circuit, comprising:
   forming a low k dielectric layer over a semiconductor substrate;
   forming a trench in said low k dielectric layer wherein said trench has a first surface with a first density;
   forming a chemically bonded surface with a second density on said first surface in said trench by exposing said first surface of said trench to super critical $CO_2$ and a silylization agent such that said second density is higher than said first density;
   forming a barrier layer in said trench over said chemically bonded surface, and
   forming copper over said barrier layer to fill said trench.

2. The method of claim 1 further comprising removing species comprising silanol, methyl, hydride, or fluoride groups from said low k dielectric by exposing said low k dielectric layer to super critical $CO_2$ and a reaction agent selected from the group consisting of trimethylchlorosilane and tetramethyldisilazane.

3. The method of claim 1 wherein said silylization agent is hexamethyldisilazane.

4. The method of claim 3 wherein the porosity of said low k dielectric is over 15% by volume.

5. The method of claim 4 wherein said barrier layer comprises titanium nitride.

6. A method for forming an integrated circuit interconnect structure, comprising:
   forming a low k dielectric layer over a semiconductor substrate;
   forming a trench in said low k dielectric layer wherein said trench has a first surface with a first density;
   forming a chemically bonded surface with a second density on said first surface in said trench by exposing said first surface of said trench to super critical $CO_2$ and a first silylization agent such that said second density is higher than said first density;
   removing species comprising silanol, methyl, hydride, or fluoride groups from said low k dielectric by exposing said low k dielectric layer to super critical $CO_2$ and a second silylization agent selected from the group consisting of trimethylchlorosilane and tetramethyldisilazane;
   forming a barrier layer in said trench over said chemically bonded surface, and
   forming copper over said barrier layer to fill said trench.

7. The method of claim 6 wherein said first silylization agent is hexamethyldisilazane.

8. The method of claim 7 wherein the porosity of said low k dielectric is over 15% by volume.

9. The method of claim 8 wherein said barrier layer comprises titanium nitride.

10. A method for forming copper interconnects in integrated circuits, comprising:
    forming a low k dielectric layer over a semiconductor substrate;
    forming a trench in said low k dielectric layer wherein said trench has a first surface with a first density;
    placing said semiconductor substrate with said low k dielectric layer in a process chamber;
    increasing the pressure in said process chamber to a pressure greater than 1050 PSI;
    increasing the temperature in the chamber to a temperature greater than 31° C.;
    exposing said low k dielectric layer to a dehydrating species;
    forming a chemically bonded surface with a second density on said first surface in said trench by exposing said first surface of said trench to super critical $CO_2$ and a first silylization agent such that said second density is higher than said first density;
    forming a barrier layer in said trench over said chemically bonded surface, and
    forming copper over said barrier layer to fill said trench.

11. The method of claim 10 further comprising the step of removing species comprising silanol, methyl, hydride, or fluoride groups from said low k dielectric by exposing said low k dielectric layer to super critical $CO_2$ and a second reaction agent selected from the group consisting of trimethylchlorosilane and tetramethyldisilazane.

12. The method of claim 10 wherein said first silylization agent is hexamethyldisilazane.

13. The method of claim 12 wherein the porosity of said low k dielectric is over 15% by volume.

14. The method of claim 13 wherein said barrier layer comprises titanium nitride.

* * * * *